United States Patent
Becker et al.

(10) Patent No.: US 7,342,435 B2
(45) Date of Patent: Mar. 11, 2008

(54) INPUT STAGE RESISTANT AGAINST NEGATIVE VOLTAGE SWINGS

(75) Inventors: Rolf Friedrich Philipp Becker, Adliswil (CH); Willem Hendrik Groeneweg, Muri (CH); Wolfgang Kemper, Unterföhring (DE)

(73) Assignee: NXP B.V., Eindhoven (NL)

( * ) Notice: Subject to any disclaimer, the term of this patent is extended or adjusted under 35 U.S.C. 154(b) by 168 days.

(21) Appl. No.: 10/564,537

(22) PCT Filed: Jul. 8, 2004

(86) PCT No.: PCT/IB2004/051177

§ 371 (c)(1), (2), (4) Date: Jan. 12, 2006

(87) PCT Pub. No.: WO2005/008776

PCT Pub. Date: Jan. 27, 2005

(65) Prior Publication Data

US 2006/0164058 A1 Jul. 27, 2006

(30) Foreign Application Priority Data

Jul. 16, 2003 (EP) .................................. 03102193

(51) Int. Cl.
*H03K 3/01* (2006.01)

(52) U.S. Cl. .................. 327/534; 327/552; 330/292

(58) Field of Classification Search ........ 327/534–540, 327/333, 561, 562, 563, 336; 330/257–267, 330/254, 296, 129, 133; 341/155, 172
See application file for complete search history.

(56) References Cited

U.S. PATENT DOCUMENTS

| 5,792,956 A * | 8/1998 | Li .................................. 73/660 |
| 6,002,355 A * | 12/1999 | Del Signore et al. ....... 341/155 |
| 6,771,124 B1 * | 8/2004 | Ezell .......................... 330/129 |

\* cited by examiner

*Primary Examiner*—Rajnikant B. Patel

(57) ABSTRACT

Apparatus (10) comprising a level shifter (15) connectable to a signal input (1) for receiving an input signal (s(t)) with a negative signal swing. The level shifter (15) provides for a DC shift of the input signal (s(t)) to provide an output signal (r(t)) with positive signal swing. The level shifter (15) comprises an amplifier (17) with a first input (11), a second input (12), and an output (13). A first capacitor (C1), a second capacitor (C2), a reference voltage supply (16), and a transistor (14; 74) serving as a switch, are arranged in a network as follows: the first capacitor (C1) is arranged between the signal input (1) and the first input (11), the second capacitor (C2) is arranged in a feedback-loop (18) between the output (13) and the first input (11), and the reference voltage supply (16) is connected to the second input (12). The transistor (14) is arranged in a branch (19) that bridges the second capacitor (C2), whereby a control signal (CNTRL) is applicable to a gate (14.1) of the transistor (14) in order to allow the level shifter (15) to be reset from time to time.

9 Claims, 6 Drawing Sheets

INPUT STAGE RESISTANT AGAINST NEGATIVE VOLTAGE SWINGS

The present invention relates to input stages having protection against negative voltage swings. In particular, the present invention relates to CMOS input stages and their protection.

While modern CMOS IC (complementary metal oxide semiconductor integrated circuit) fabrication technologies are going down with critical geometrical dimensions, the maximum allowed voltage swing across individual transistors and with it the maximum allowed supply voltage is going down rapidly. On the other hand, the signal swing at an input port of a CMOS device may go beyond these voltage limits. Even more problematic is the fact that there are applications where input signals with a negative voltage swing may occur.

A CMOS device typically comprises some kind of a level shifter 5, as illustrated in FIG. 1, in order to shift the voltages at the input pad 1 to the lower levels of the VDD voltage domain of the core 6 of the CMOS device. Such a level shifter 5, however, is not suited to handle input signals with a negative voltage swing.

CMOS ICs have to be protected against electrostatic discharge (ESD) in order to make sure that the circuit is not damaged by voltage peaks. Usually, ESD (ESD) protection elements, such as diodes 2 and 3 are provided between the circuit's input pad 1, the voltage supply terminal VDD and ground GND, as depicted in FIG. 1. ESD protection is employed in order to prevent the very sensitive level shifter 5 from being destroyed when it is subjected to a discharge event. This might happen for example when somebody induces a voltage peak into the circuitry by touching the pins of the chip. Such an ESD protection scheme does not function when negative voltages are applied to the input pad 1, since the diode 3 would enter conduction, which would lead to a clipping of the input signal.

More details about ESD protection and level shifting for CMOS devices handling input signals with positive signal swings are addressed in the co-pending patent application entitled "INPUT STAGE RESISTANT AGAINST HIGH VOLTAGE SWINGS", as filed on Jun. 2, 2002 Application number EP02002681.1 was assigned to this co-pending application.

It is an object of the present invention to provide input stages that are able to handle negative voltage swings and to provide apparatus based thereon.

It is another object of the present invention to provide input stages that are able to handle negative voltage swings and to withstand ESD events, and to provide apparatus based thereon.

These and other objects are accomplished by an apparatus circuit according to claim 1. Further advantageous implementations are claimed in claims 2-9.

The present invention allows to realize circuits with reduced fabrication technology costs and less complex system design.

For a more complete description of the present invention and for further objects and advantages thereof, reference is made to the following description, taken in conjunction with the accompanying drawings, in which.

Figure 1:
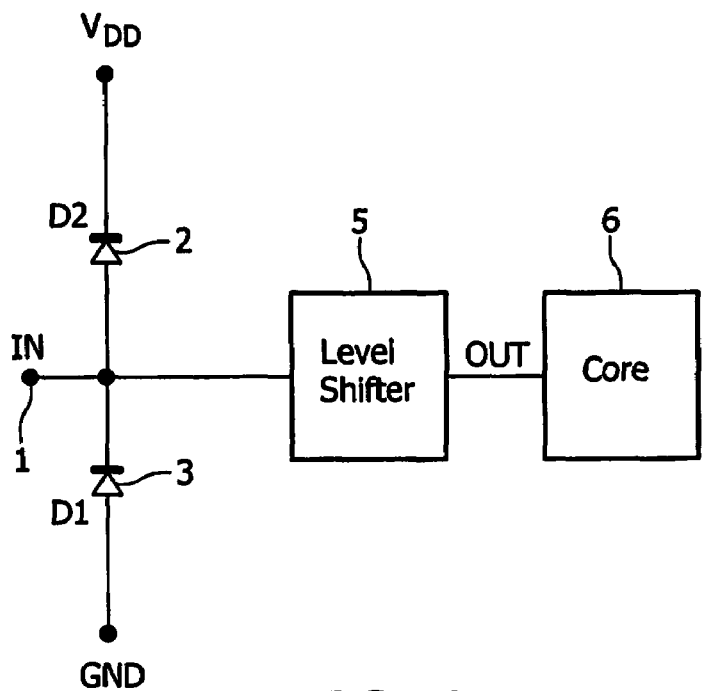
FIG. 1 is a schematic representation of a conventional CMOS device with ESD protection and level shifter.
Figure 2:
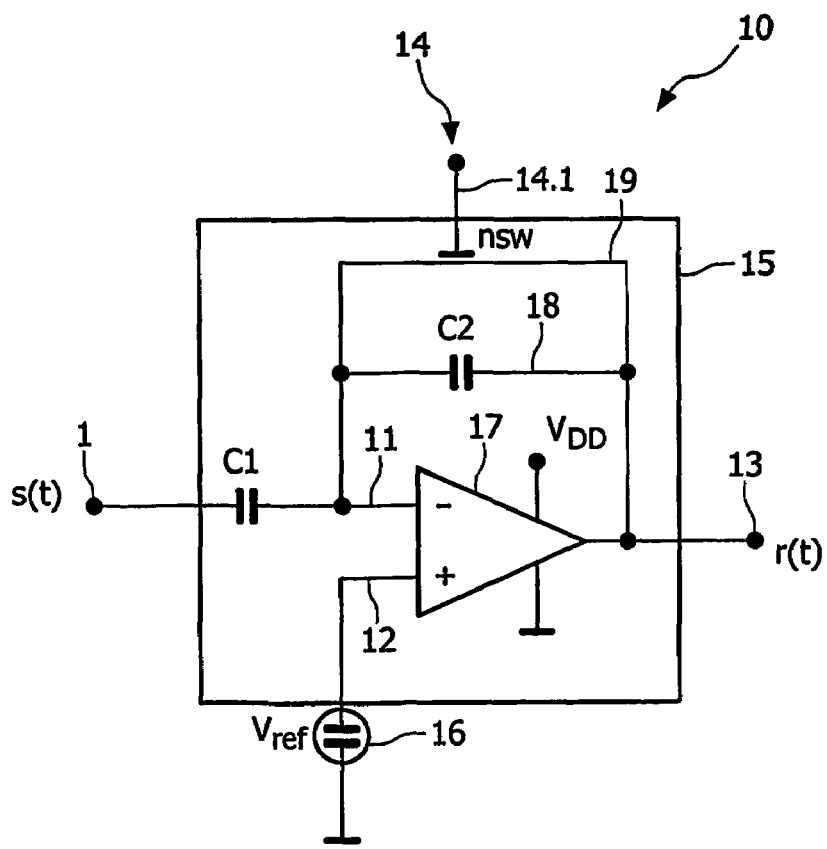
FIG. 2 is a schematic representation of a first embodiment of the present invention.

A first embodiment of the present invention is illustrated in FIG. 2. In this Figure, an input stage 10, according to the present invention is shown. It comprises a level shifter 15 being connectable to a signal input 1. The input stage 10 receives an input signal s(t) with a negative signal swing. Since the subsequent circuits, herein referred to as core, are not able to handle negative signals at all, the level shifter 15 provides for a DC shift of said input signal s(t) in order to provide an output signal r(t) with positive signal swing only. As illustrated in FIG. 2, the level shifter 15 comprises an amplifier 17 having a first input 11, a second input 12, and an output 13. The amplifier 17 is part of a network comprising a first capacitor C1, a second capacitor C2, and a transistor 14 serving as a switch. Preferably, the transistor 14 is an n-channel MOS transistor. The first capacitor C1 is arranged between the signal input 1 and the amplifier's first input 11. The second capacitor C2 is arranged in a feedback-loop 18 between the output 13 and the first input 11. There is a reference voltage supply 16 that applies a reference voltage $V_{ref}$ to the amplifier's second input 12.

The transistor 14 is arranged in a branch 19 that bridges the second capacitor C2. When applying a high level control signal CNTRL to the gate 14.1 of the transistor 14, the level shifter 15 is initialized or reset. The reset is typically performed each time before an input signal s(t) is applied to the input 1.

Whenever the switch 14.1 is closed, the amplifier 17 acts as a unity-gain voltage follower of reference voltage 16, so the output 13 and the input 11 are set close to $V_{ref}$. Thus the capacitor C1 is charged to $V_{ref}$-s(t) and DC-level shifting of the input is achieved. As soon as the switch 14.1 is opened, the amplifier 17 together with C1 and C2 acts as an inverting amplifier with a gain of -C1/C2.

One may for instance, set the control signal CNTRL to high and release it at the time t0, right before the input signal s(t) is applied. After t0 the output signal r(t) is given by:

$$r(t) = -\frac{C1}{C2} \cdot (s(t) - s(t)|_{t=t0}) + V_{ref} \quad (1)$$

This equation (1) shows that the DC shift provided by the input stage 10 can be determined by the reference voltage $V_{ref}$ and by the ratio of C1 and C2. This gives arbitrary freedom to accommodate any input voltage swing. The control signal CNTRL is activated from time to time or whenever needed, in order to compensate for a potential discharge of the capacitor C1. The discharging occurs due to inevitable leakage currents.

For devices that are made using deep submicron processes, it is important that none of the devices' transistors is subjected to destructive voltages across their terminals. According to the present invention, a high voltage is only carried on the capacitor C1, which should be constructed out of available layers, like metal interconnect sandwich structures, or fringe capacitors, which are able to withstand higher voltages.

Figure 3:
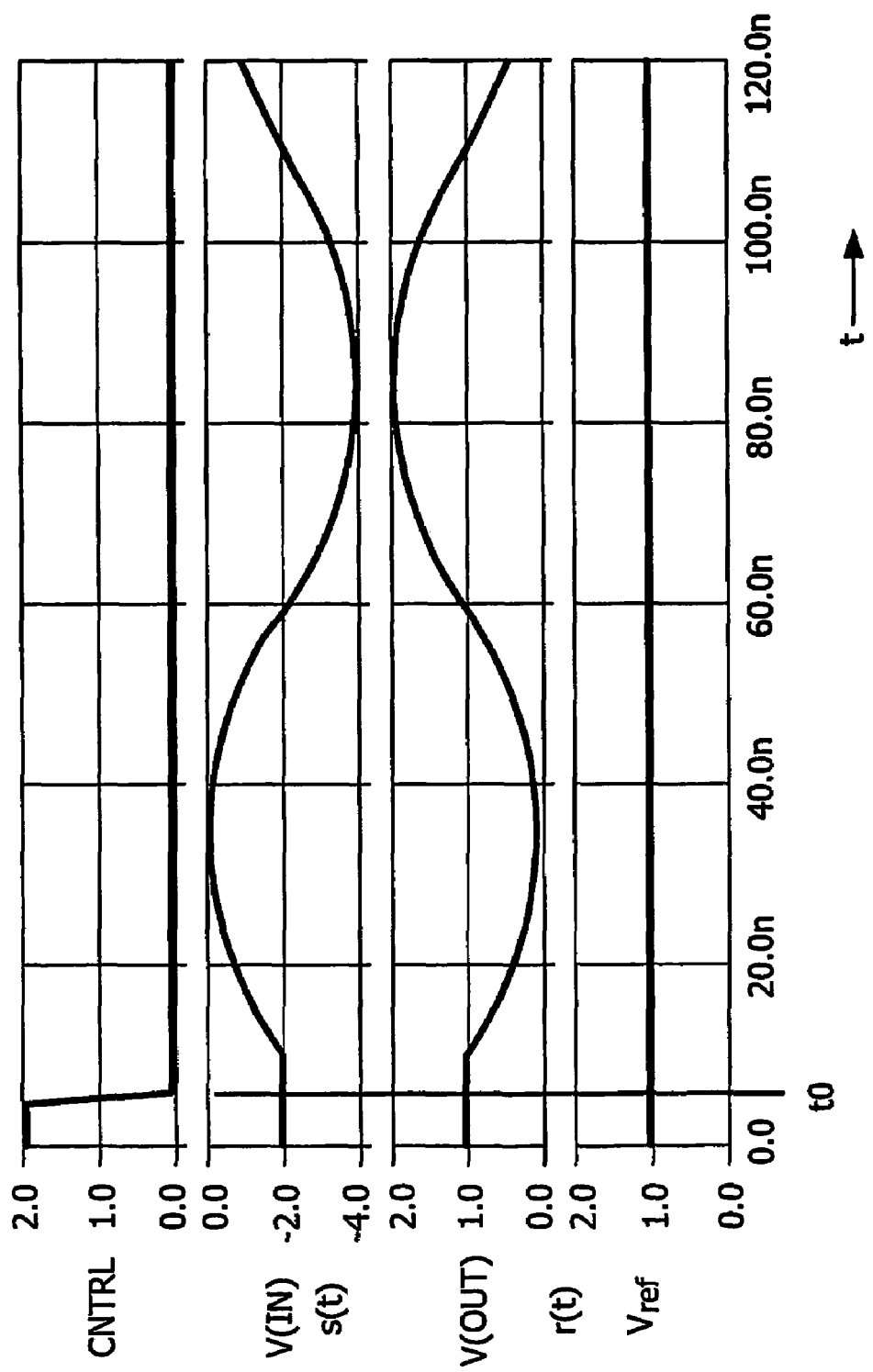
FIG. 3 is a diagram showing the various signals in an apparatus according to the present invention.

FIG. 3 shows an example for a constant reference voltage $V_{ref}=1V$ and a sine wave s(t) at the input 1 with a swing between 0V and −4V. The amplifier 17 has a gain of 0.5. At the time t=t0, the control signal CNTRL is released. This signal is released shortly before the signal s(t) is applied to the input 1. The sine wave s(t) starts to oscillate between 0V and −4V. According to the present invention, the output signal r(t) is DC shifted. In the present example, the output signal r(t) oscillates around +1V and has an amplitude of 1V. The output signal r(t) does not enter the negative voltage regime.

The device 10 can be modified by adding additional capacitors and switches in order to allow the DC shift to be adjusted, according to current needs. Further details will be given in connection with another embodiment.

Figure 4:
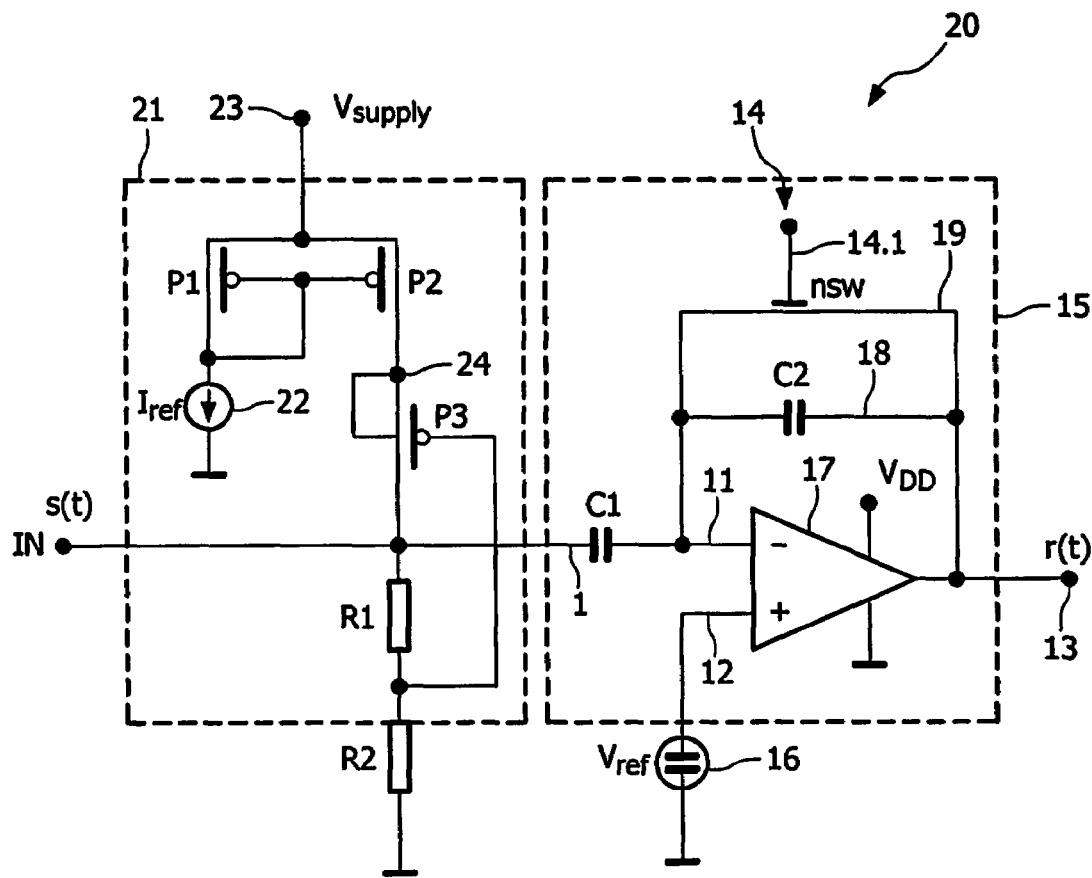
FIG. 4 is a schematic representation of a second embodiment of the present invention.

Another embodiment, according to the present invention, is depicted in FIG. 4. An apparatus 20 is shown in FIG. 4 that comprises a level shifter 10, or another level shifter according to the present invention, and a bias current source 21. The current source 21 comprises a network having a plurality of PMOS transistors P1, P2, P3, resistors R1 and R2, and a reference current source 22. The current source 21 is constructed with a current mirror comprising the transistors P1 and P2 connected to a supply voltage node 23. A supply voltage Vsupply is applied to this node 23. As stated above, in a deep submicron fabrication process the voltage across the terminals of individual transistors must not go beyond the maximum specified voltage Vmax, which generally is close to Vsupply. This would mean that the transistor P2 would be biased beyond the allowed operation range when its source is directly connected to the input node IN. To prevent destruction of the transistor P2, a special cascode transistor P3 is added, which absorbs any voltage beyond Vsupply, if the input signal s(t) at the node IN goes below 0V. The two resistors R1 and R2 serve as resistive divider controlling the gate of the cascode transistor P3 depending on the input voltage s(t). If required, additional cascode transistors can be put in series with the cascode transistor P3 to allow for a higher protection range. In this way the voltage between the node 23 and the node 24 is kept below Vsupply.

The current source 21 is designed so that itself is protected against negative input voltages.

If Vtp is the threshold voltage of the transistor P3 and s(INmin) the minimum voltage at the input node IN, the resistive divider is dimensioned to be:

$$-s(INmin) = \frac{R1 + R2}{R2} \cdot Vtp \quad (2)$$

Figure 5:
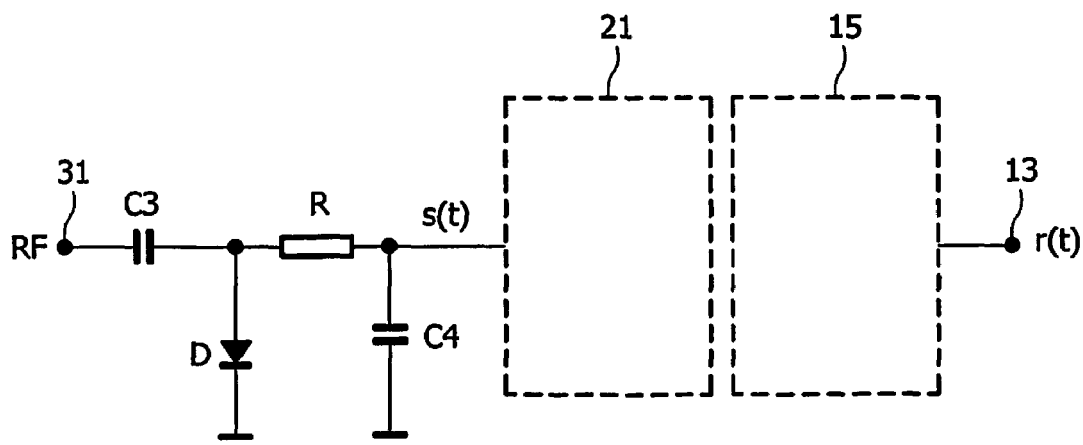
FIG. 5 is a schematic representation of a third embodiment of the present invention.

Many applications require a bias current source, preferably on chip. A typical example is a sensor for measuring the power of an RF connection like an antenna. A respective embodiment is illustrated in FIG. 5. In this Figure, an apparatus 30 is illustrated. It comprises a level shifter 10 or 15, or another level shifter according to the present invention, and a bias current source 21 like the one depicted in FIG. 4.

The apparatus 30 serves as peak detector for a radio frequency signal RF. At the input side, there is a network comprising two capacitors C3 and C4, a resistor R, and a diode D. An RF signal is applied to an RF node 31. The current source 21 is designed such that the diode D is properly biased.

Figure 6:
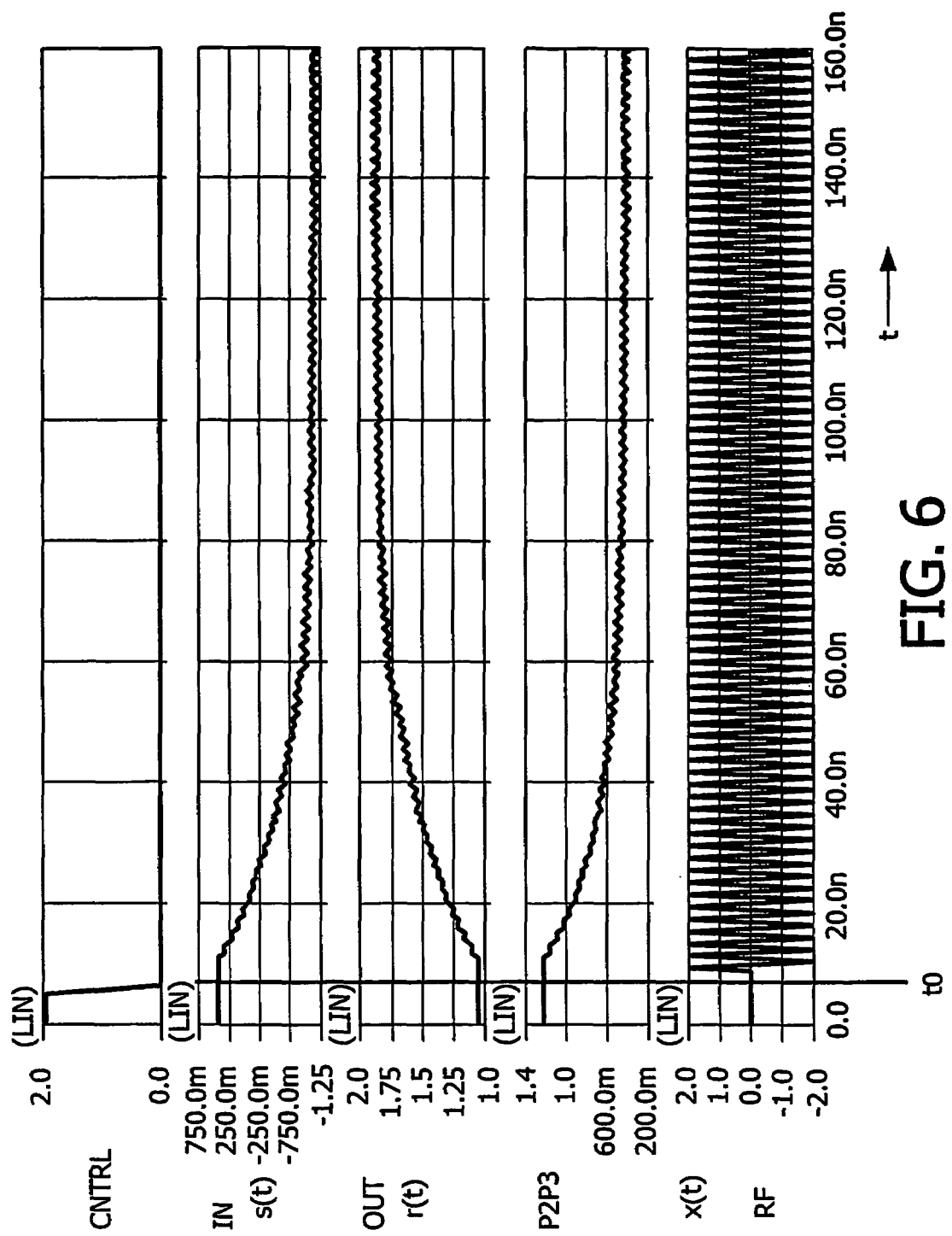
FIG. 6 is a diagram showing the various signals in an apparatus according to the present invention.

FIG. 6 shows an example for a constant reference voltage and an RF voltage at the input 31 with a swing between 2V and −2V. At the time t=t0, the control signal CNTRL is released. This control signal CNTRL is released shortly before the RF signal is applied to the input 31. The RF signal starts to oscillate between 2V and −2V.

FIG. 6 shows the biasing of the diode D at about t=t0, and the transformation of a negative voltage s(t) to a positive voltage r(t). In FIG. 6, the voltage x(t) at the node 24 (between the transistors P2 and P3) is shown. While the voltage s(t) goes below 0V, the voltage x(t) at node 24 stays within the safe range. This is, the transistor P3 is activated, as desired.

According to the present invention, the output signal r(t) is DC shifted. In the present example, the output signal r(t) does not enter the negative voltage regime.

Figure 7:
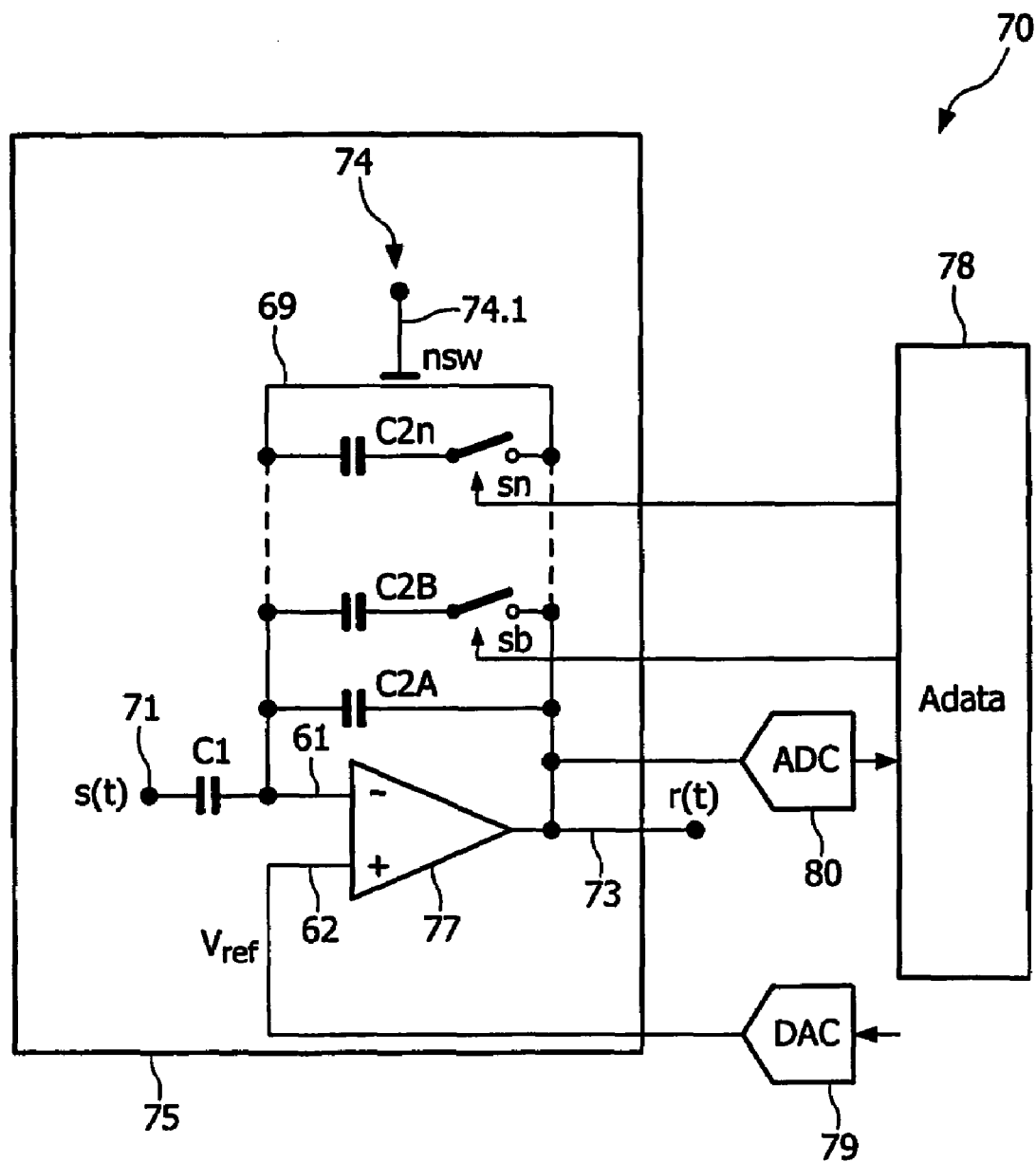
FIG. 7 is a schematic representation of a fourth embodiment of the present invention.

Yet another embodiment, according to the present invention, is depicted in FIG. 7. In FIG. 7, an apparatus 70 is illustrated where the reference voltage $V_{ref}$ and the ratio C1/C2 can be changed. In this Figure, an input stage is shown. It comprises a level shifter 75 being connectable to a signal input 71. The input stage receives an input signal s(t) with a negative signal swing. Since the subsequent circuits (not illustrated in FIG. 7) are not able to handle negative signals at all, the level shifter 75 provides for a DC shift of said input signal s(t) in order to provide an output signal r(t) at an output 73 with positive signal swing only. As illustrated in FIG. 7, the level shifter 75 comprises an amplifier 77 having a first input 61, a second input 62, and an output 73. The amplifier 77 is part of a network comprising a first capacitor C1, an array of n second capacitors C2A, C2B through C2n, and a transistor 74 serving as a switch (nsw). Preferably, the transistor 74 is an n-channel MOS transistor. The first capacitor C1 is arranged between the signal input 71 and the amplifier's first input 61. The second capacitors C2A, C2B through C2n are arranged in a feedback-loop between the output 73 and the first input 61. A reference voltage $V_{ref}$ is supplied by a controller 78 and a digital-to-analog (DAC) converter 79 to the amplifier's second input 62. The output voltage r(t) at the output 73 is measured with an analog-to-digital converter (ADC) 80 and fed as digital data (Adata) to the controller 78. The controller 78 is a digital controller which sets the reference voltage $V_{ref}$ at the input 62 with the aid of the digital-to-analog (DAC) converter 79. Furthermore, the controller 78 tunes the gain of the amplifier 77 by switching the capacitors C2B to C2n in parallel to C2A. If the switching signal sb is applied, the second capacitance C2 is defined by a parallel arrangement of C2A and C2B, for example. That is, C2=C2A+C2B. In this case, the output signal r(t) is given by the equation (3):

$$r(t) = -\frac{C1}{C2A + C2B} \cdot (s(t) - s(t)|_{t=t0}) + V_{ref} \quad (3)$$

The gain is determined by:

$$gain = \frac{C1}{C2A + \sum_{i=B}^{n}(C2i \cdot ai)} \quad (4)$$

with ai=1, when the switch s is closed and ai=0, when the switch 8 is open. Like the apparatus described before, from time to time a reset is required, since the capacitors C1, and C2A to C2n get discharged due to leakage currents.

It is also possible to employ a programmable array of capacitors instead of the single first capacitor C1.

Figure 8:
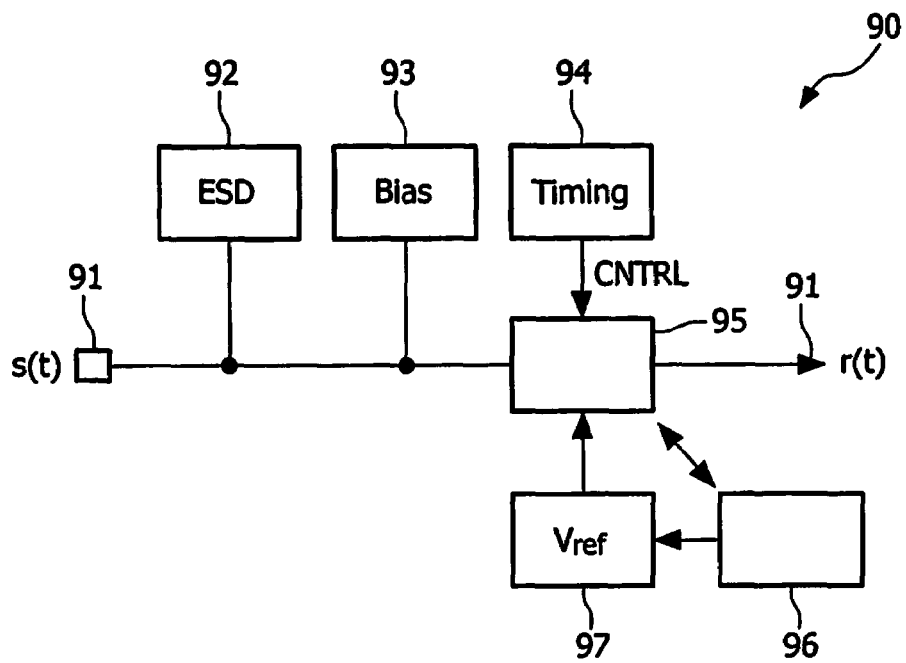
FIG. 8 is a schematic representation of a fifth embodiment of the present invention.

A block diagram of an apparatus 90 similar to the one depicted in FIG. 7, is given in FIG. 8. The apparatus 90 comprises an input pad 91 where a signal s(t) with negative signal swing is applied. An ESD protection 92 is provided in order to prevent the core against all possible ESD overstress situations. A bias current source 93, similar to the one illustrated in FIG. 4 is provided. A level shifter 95 provides for a DC shift of the signal s(t) at its input 91. A timing circuit 94 provides a control signal CNTRL in order to reset the circuit from time to time. A reference voltage $V_{ref}$ is provided by a reference voltage source 97. The gain of an amplifier inside the level shifter 95 and the reference voltage $V_{ref}$ may be controlled and adjusted by a controller 96, similar to the one illustrated in FIG. 7. The output 91 is connected to a circuit core which is not illustrated in FIG. 8.

Figure 9:
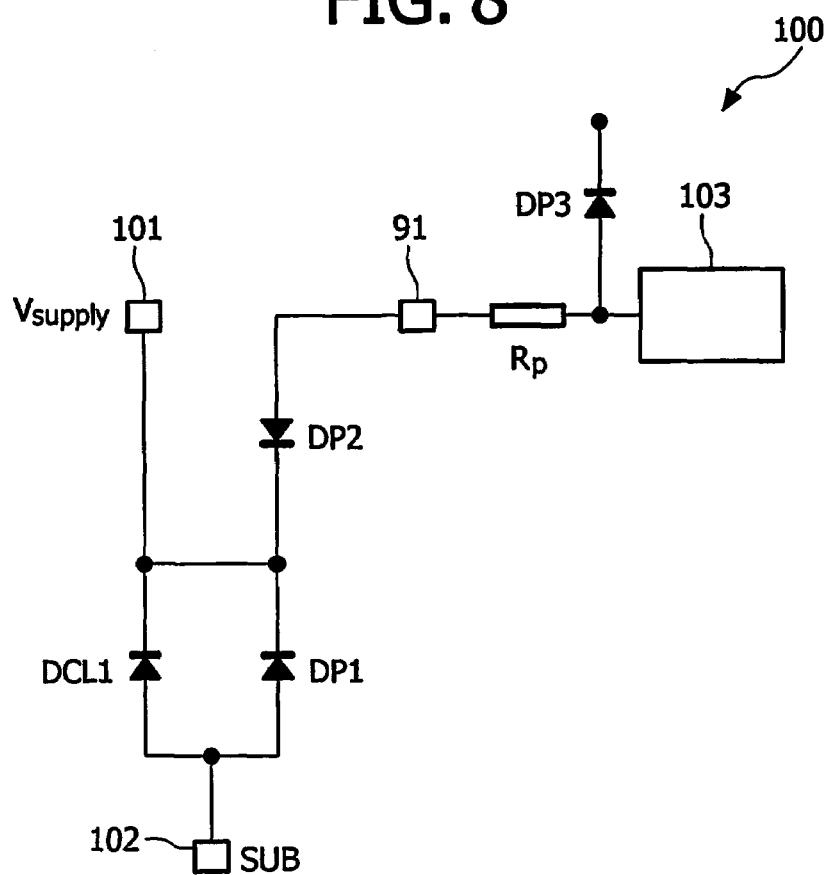
FIG. 9 is a schematic representation of an ESD protection scheme, according to the present invention.

The general ESD protection scheme, applied in connection with the present invention, is schematically illustrated in FIG. 9. There are two diodes DP1 and DP2 that are arranged to protected the level shifter and core 103. The diode DP2 is situated between the input node 91 and the supply node 101 and the diode DP1 is situated between the supply node 101 and the substrate 102. A clamp diode DCL1 is situated between the supply node 101 and the substrate 102. The diodes used must be robust enough to withstand the wanted ESD level. Preferably, the diode DP1 comprises an Nwell laying inside a P-epitaxy or P-well layer. The Nwell to substrate 102 breakdown voltage is preferably greater than 20V, for example. The diode DP2 comprises a p+active region inside the Nwell that also builds the diode DP1. The breakdown voltage of the diode DP2 is preferably greater than 12V. The power protection clamp diode DCL1 limits the voltage on the supply node 101. The limit may be set to be 1 V, for example. The resulting voltage range for the input node 91 is therefore 12V to $V_{supply}$+Vf (diode forward voltage), with the restriction that $V_{supply}<V_{br}$ (the breakdown voltage of the diode DCL1). Preferably, a protection resistor Rp is situated at the input of the level shifter and core 103, as illustrated in FIG. 9.

For multi power domains, each domain must have such a combination of a P type diode D1 and power clamp diode DCL1.

In addition to the protection scheme illustrated in FIG. 9, it is advantageous to employ a so-called secondary protection scheme in order to protect the elements of the level shifter and core. Two different cases are dealt with in the following:
1. If the core is a PMOS drain, this drain must be protected against electrical overstress. This can be done by means of a protection resistor. This resistor is to be calculated to prevent the maximum current not to cause any damage at the PMOS drain of the core.
2. If the core is a gate, an RC low pass filter built by a protection resistor Rp and a diode p towards $V_{supply}$ is recommended as protection. This is necessary, since in modern semiconductor processes, the gate breakdown voltage is very low. The time constant of the RC low pass filter should be around 50 ps, for example. In general, the protection resistor should be as large as possible, the restrictions are given by the switching frequency and input driving capability of the circuit that provides the input signal s(t) to the apparatus according to the present invention.

Due to the close voltage limitations, it is recommended to have the VDD protection as close as possible to the supply node. Otherwise, the interconnect lines cause an additional voltage drop resulting injunction or gate oxide breakdown in the core.

The present scheme can be used to protect CMOS (complementary metal oxide semiconductor) and BiCMOS circuits (bipolar devices combined with CMOS subcircuits on a single chip), for example.

The present invention can be used in mobile phones and other devices where the RF power of an antenna is measured from time to time. The invention can also be used in electricity counters, interface circuits (such as RS232) and so forth.

In the drawings and specification there has been set forth preferred embodiments of the invention and, although specific terms are used, the description thus given uses terminology in a generic and descriptive sense only and not for purposes of limitation.

The invention claimed is:

1. An apparatus comprising a level shifter connectable to a signal input for receiving an input signal with a negative signal swing, said level shifter providing for a DC shift of said input signal to provide an output signal with positive signal swing, said level shifter comprising: an amplifier having a first input, a second input, and an output, a first capacitor, a second capacitor, a reference voltage supply, and a transistor serving as a switch, wherein said first capacitor is arranged between said signal input and said first input, said second capacitor is arranged in a feedback-loop between the output and said first input, said reference voltage supply is connectable to said second input, and wherein said transistor is arranged in a branch that bridges the second capacitor, whereby a control signal is applicable to a gate of said transistor in order to allow the level shifter to be reset from time to time.

2. The apparatus of claim 1, wherein the gain of the amplifier is adjustable by varying the effective capacitance of the capacitors.

3. The apparatus of claim 2, wherein a branch that bridges the second capacitor is provided, said branch comprising a capacitor in series with a switch, whereby the effective capacitance can be varied by opening or closing the switch.

4. The apparatus of claim 2, comprising an analog-to-digital converter connectable to the output for determining the voltage level at the output and a controller for receiving digital information from to the analog-to-digital converter, said digital information representing the voltage level, said controller providing a signal to adjust the effective capacitance.

5. The apparatus of claim 1, comprising a digital-to-analog converter serving as reference voltage supply, said digital-to-analog converter preferably receiving a digital signal from a controller.

6. The apparatus of claim 1, comprising a bias current source with a network having a plurality of transistors, resistors, and a reference current source.

7. The apparatus of claim 6, wherein one of the transistors is a cascode transistor which is arranged with respect to one of the other transistors so as to absorb any voltage beyond a supply voltage, if the input signal at falls below 0V.

8. The apparatus according to claim 1, further comprising ESD protection means being adapted to handle negative voltage swings at the signal input.

9. The apparatus of claim 8, wherein the ESD protection means comprise a first diode, a second diode, and a third diode, said first diode being situated between the signal input and a supply node, said second diode being situated between the supply node and a substrate, and said third diode being situated between the supply node and the substrate.

* * * * *